United States Patent
Fogel et al.

(10) Patent No.: US 10,439,106 B2
(45) Date of Patent: Oct. 8, 2019

(54) LIGHT EMITTING DIODE WITH ZNO EMITTER

(71) Applicant: INTERNATIONAL BUSINESS MACHINES CORPORATION, Armonk, NY (US)

(72) Inventors: Keith E. Fogel, Hopewell Junction, NY (US); Jeehwan Kim, Los Angeles, CA (US); Ning Li, White Plains, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 88 days.

(21) Appl. No.: 14/788,018

(22) Filed: Jun. 30, 2015

(65) Prior Publication Data

US 2017/0005229 A1   Jan. 5, 2017

(51) Int. Cl.
*H01L 33/30* (2010.01)
*H01L 33/38* (2010.01)
*H01L 33/42* (2010.01)
*H01L 21/02* (2006.01)
(Continued)

(52) U.S. Cl.
CPC ........ *H01L 33/42* (2013.01); *H01L 21/02392* (2013.01); *H01L 21/02554* (2013.01); *H01L 33/30* (2013.01); *H01L 33/40* (2013.01); *H01L 21/0262* (2013.01); *H01L 33/14* (2013.01); *H01L 2933/0016* (2013.01)

(58) Field of Classification Search
CPC ......... H01L 33/30; H01L 33/14; H01L 33/42; H01L 33/0062; H01L 33/38; H01L 2933/0016; H01L 21/02554; H01L 33/40–42; H01L 2933/0066
See application file for complete search history.

(56) References Cited

U.S. PATENT DOCUMENTS

| | | | | |
|---|---|---|---|---|
| 5,300,791 A | * | 4/1994 | Chen | H01L 33/02 257/103 |
| 5,822,347 A | * | 10/1998 | Yokogawa | B82Y 20/00 372/45.01 |

(Continued)

FOREIGN PATENT DOCUMENTS

CN    101556894 B    7/2011

OTHER PUBLICATIONS

Palimar et al., 2012. Study of the Aluminium Oxide Doped Zinc Oxide Thin Films Prepared by Thermal Evaporation Technique. Journal of Applied Sciences, 12: 1775-1777.*

(Continued)

*Primary Examiner* — Savitir Mulpuri
(74) *Attorney, Agent, or Firm* — Tutunjian & Bitetto, P.C.; Erik Johnson

(57) ABSTRACT

A light emitting diode (LED) includes a p-type ohmic contact and a p-type substrate in contact with the p-type ohmic contact. A p-type confinement layer is provided on the p-type substrate. An emission layer is provided on the p-type confinement layer. An n-type confinement layer is provided on the emission layer. A transparent II-VI n-type contact layer is formed on the n-type confinement layer as a replacement for a current spreading layer, a III-V contact layer and an n-type ohmic contact.

3 Claims, 2 Drawing Sheets

(51) Int. Cl.
*H01L 33/40* (2010.01)
*H01L 33/14* (2010.01)

(56) References Cited

U.S. PATENT DOCUMENTS

| | | | |
|---|---|---|---|
| 6,107,648 A * | 8/2000 | Shakuda | H01L 33/02 257/103 |
| 6,590,918 B1 * | 7/2003 | Mannou | B82Y 20/00 257/79 |
| 6,917,158 B2 | 7/2005 | Lee et al. | |
| 7,061,065 B2 * | 6/2006 | Horng | H01L 33/42 257/434 |
| 7,888,684 B2 | 2/2011 | Oike et al. | |
| 8,017,963 B2 | 9/2011 | Donofrio et al. | |
| 8,628,994 B2 | 1/2014 | Tomoda | |
| 2007/0164304 A1 * | 7/2007 | Takeuchi | H01L 33/30 257/103 |
| 2008/0283858 A1 | 11/2008 | Jiang et al. | |
| 2010/0224891 A1 * | 9/2010 | Zhang | H01L 33/0079 257/94 |
| 2011/0147786 A1 * | 6/2011 | Song | H01L 33/14 257/99 |
| 2012/0228658 A1 * | 9/2012 | Sasaki | H01L 33/14 257/98 |
| 2013/0099255 A1 * | 4/2013 | Lee | H01L 33/42 257/79 |
| 2013/0200414 A1 * | 8/2013 | Hsu | H01L 33/507 257/98 |

OTHER PUBLICATIONS

Tun, C.J. et al., "Enhanced Light Output of GaN-Based Power LEDs With Transparent Al-Doped ZnO Current Spreading Layer," IEEE Photonics Technology Letters, vol. 18 No. 1, Jan. 2006. (pp. 274-276).

* cited by examiner

LIGHT EMITTING DIODE WITH ZNO EMITTER

BACKGROUND

Technical Field

The present invention relates to photodiodes, and more particularly to photodiodes with a II-VI n-type layer to reduce fabrication steps and device complexity.

Description of the Related Art

Conventional red light emitting diodes (LEDs) include a p-type ohmic contact on one side of a p-type GaAs substrate. A p-type AlInP is formed on the GaAs substrate, and an AlGaInP emission layer is formed the AlInP layer. An n-type AlInP layer is formed on the emission layer followed by a current spreading layer of n-type AlGaAs. The current spreading layer is approximately about 2 microns in thickness. A GaAs contact layer is formed on the spreading layer. An n-type ohmic contact is formed over the contact layer.

With the exception of the ohmic contacts (n-type and p-type), which include a highly conductive material (metal), the other layers in the LED are monocrystalline and limited by lattice matching to adjacent layers. In addition, these layers are typically grown in epitaxial deposition processes to form monocrystalline structures. Other issues include light absorption at the contact layer, which results in device losses. In addition, the n-type ohmic contact is generally comprised on an opaque metal, which may cause shadowed areas. The shadow areas reduce the performance of the device.

SUMMARY

A light emitting diode (LED) includes a p-type ohmic contact and a p-type substrate in contact with the p-type ohmic contact. A p-type confinement layer is provided on the p-type substrate. An emission layer is provided on the p-type confinement layer. An n-type confinement layer is provided on the emission layer. A transparent II-VI n-type contact layer is formed on the n-type confinement layer as a replacement for a current spreading layer, a III-V contact layer and an n-type ohmic contact.

Another light emitting diode (LED) includes a p-type monocrystalline III-V substrate; a p-type ohmic contact formed on the substrate on a first side; a p-type confinement layer formed on a second side on the substrate opposite the first side and an emission layer formed on the p-type confinement layer and including GaInP for producing red light when activated. An n-type confinement layer is formed on the emission layer. A zinc oxide (ZnO) contact layer is formed on the n-type confinement layer as a replacement for a current spreading layer, a III-V contact layer and an n-type ohmic contact.

A method for forming a light emitting diode (LED) includes providing a p-type ohmic contact, a p-type substrate in contact with the p-type ohmic contact, a p-type confinement layer on the p-type substrate, a GaInP emission layer on the p-type confinement layer and an n-type confinement layer on the emission layer; and forming a transparent zinc oxide n-type contact layer directly on the n-type confinement layer as a replacement for a current spreading layer, a III-V contact layer and an n-type ohmic contact.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
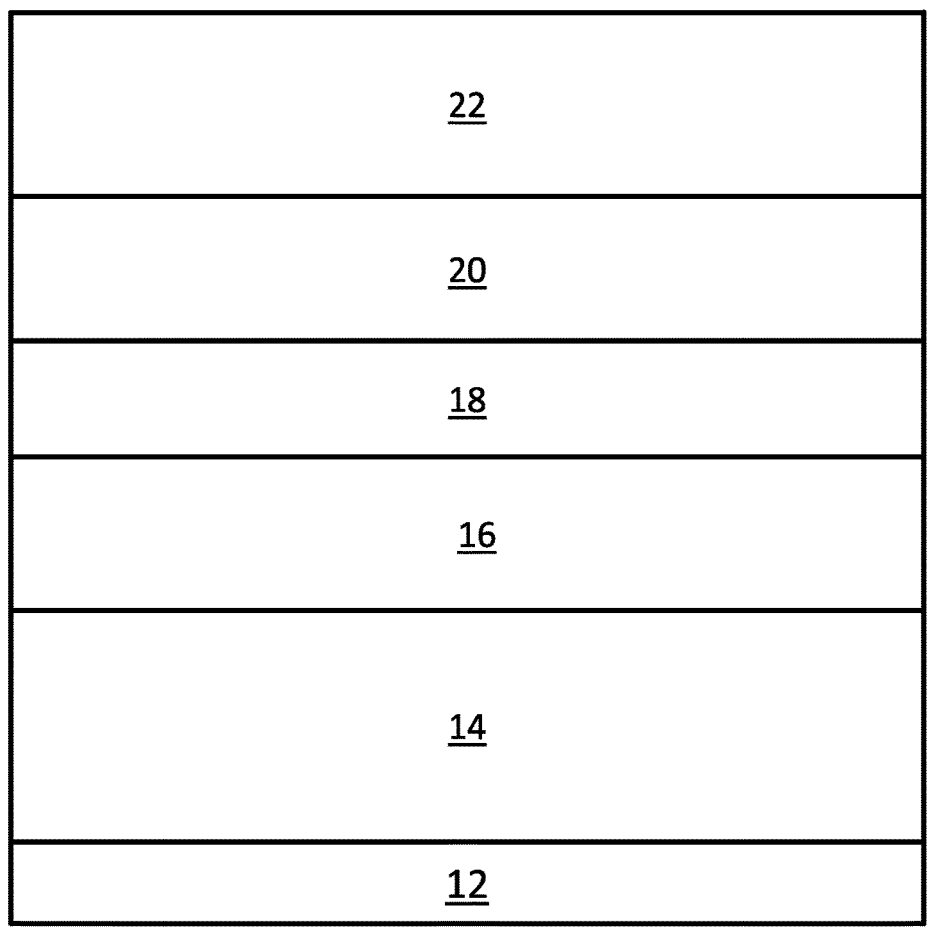
FIG. 1 is a cross-sectional view of a light emitting diode with a single layer emitter replacement structure in accordance with the present principles.

In accordance with the present principles, a light emitting diode (LED) is provided that simplifies conventional devices. A II-VI material, such as ZnO, is employed to replace three layers of the conventional device with a single thinner layer. The three layers of the conventional device that are replaced include a current spreading layer, a contact layer and an n-type ohmic contact.

Embodiments in accordance with the present principles provide many advantages over the conventional structure. For example, the LED in accordance with the present embodiments provides for better current spreading and more uniform light emission resulting in a higher brightness. The II-VI (ZnO) material provides for higher transparency and no metal shadowing areas. In addition, there is less current crowding due to the simpler structure (e.g., fewer interfaces), and the simpler structure and material selection result in a lower cost for the LED.

It is to be understood that the present invention will be described in terms of a given illustrative architecture; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a light emitting diode (LED) device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of LED devices and/or integrated circuit chips with LED devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The devices described herein are particularly useful for electronic devices, etc.

It should also be understood that material compounds will be described in terms of listed elements, e.g., GaAs or ZnO. These compounds include different proportions of the elements within the compound, e.g., GaAs includes $Ga_xAs_{x-1}$, where x is less than or equal to 1, or ZnO includes $Zn_xO_{1-x}$ where x is less than or equal to 1, etc. In addition, other elements may be included in the compound, such as, e.g., AlGaAs. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a light emitting diode (LED) 10 is illustratively shown in accordance with the present principles. The LED 10 includes a p-type ohmic contact 12 formed on a back of the LED 10. The ohmic contact 12 is formed on a p-doped substrate 14. The p-doped substrate 14 preferably includes a III-V material, such as GaAs, although other materials may be employed. A p-type confinement layer 16 is formed on the substrate 14. The p-type confinement layer 16 may include a III-V material, such as AlInP. In one embodiment, the p-type confinement layer 16 includes AlInP having a thickness of about 1 micron, although other thicknesses are contemplated.

An emission layer 18 is formed on the p-type confinement layer 16 and may include AlGaInP. The emission layer 18 is approximately about 0.5 microns in thickness. An n-type confinement layer 20 is formed on the emission layer 18. The emission layer 18 is sandwiched between the p-type confinement layer 16 and the n-type confinement layer 20. The p-type confinement layer 16 and the n-type confinement layer 20 preferably include a same thickness dimension (approximately 1 micron) and material (e.g., AlInP, p-doped and n-doped, respectively) to provide symmetry about the emission layer 18. Note that the emission layer 18 may include different structures including but not limited to multiple quantum well (MQW) structures with multiple layers.

In accordance with particularly useful embodiments, an n-type contact layer 22 is formed on the n-type confinement layer 20. While the n-type contact layer 22 may include a II-VI material, such as ZnS, ZnSe, CdS, CdTe, the n-type contact layer 22 preferably includes a doped form of a transparent II-VI layer, such as zinc oxide (ZnO), although indium tin oxide (ITO), indium zinc oxide (IZO), or other transparent materials may be employed. In one useful embodiment, the n-type contact layer 22 includes Al doped ZnO (ZnO:Al or AZO). The n-type contact layer 22 may include a thickness of between about 200 nm to about 700 nm, and preferably about 500 nm.

The n-type contact layer 22 is substantially thinner than the conventional layers employed on the n-type side of a conventional diode that it replaces. The conventional diode employs a current spreading layer (e.g., having a thickness of about 2 microns), a GaAs contact layer (e.g., having a thickness of about 100-250 nm) and an n-type ohmic contact (e.g., greater than 200 nm). The conventional layers include a nominal thickness of between about 2 microns to about 3 microns or greater. In accordance the present principles, conventional layer (i.e., the current spreading layer, contact layer and the n-type ohmic contact) are replaced with a single n-type contact layer 22. The n-type contact layer 22 (which does not need an additional metal contact layer) may include a thickness of nominally about 500 nm, which is 4-6 (or more) times thinner than the n-type side of a conventional LED.

In addition, conductivity is maintained or improved (due at least to reducing the number of interfaces in the n-type side). Metal shadowing area (e.g., due the metal ohmic contact) is reduced or eliminated, transmission of light is improved (due at least to the reduced thickness and the elimination of metal shadowing) and the structure is simplified making it more cost effective and less complex to fabricate. In particularly useful embodiments, the n-type contact layer 22 provides a single layer emission structure.

The formation of ZnO:Al also tends to be easier than III-V materials, which would conventionally be employed in the spreading layer and the contact layer. For example, instead of epitaxial growth processes (e.g., for a GaAs contact layer and an AlGaAs for the current spreading layer), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO.

In accordance with the present principles, a range of n-doping in ZnO of layer 22 is up to 2 atomic percent (e.g., $\sim 5 \times 10^{21}/cm^3$). ZnO dopants may include Al, B, Ga, In, etc., with Al:ZnO being preferred. ZnO may be deposited or grown by one or more of the following processes, epitaxy, sputtering, atomic layer deposition (ALD), metal organic chemical vapor deposition (MOCVD), etc. The carrier concentration (electron density) of the layer 22 may be between about $1 \times 10^{21}$ cm$^{-3}$ to about $5 \times 10^{21}$ cm$^{-3}$, and preferably about $3.0 \times 10^{21}$ cm$^{-3}$ for doped Aluminum Zinc Oxide (ZnO:Al) (AZO).

The n-type material (e.g., ZnO:Al) is preferably crystalline in form. This includes a monocrystalline structure and may include a multi-crystal structure or other crystalline structure (micro, nano, etc.). However, the AZO material may also include amorphous phases. In one embodiment, the ZnO of layer 22 is amorphous. The underlying layers are also preferably crystalline, but may include other phases.

Conventional ohmic contacts may include, e.g., Ti, Pd, Au. The conventional diode having an ohmic contact including Ti/Pd/Au often needs to be formed in a metal grid pattern to permit light transmission and is needed to increase conductivity on GaAs n-type material for a conventional device. This metal grid prevents light transmission (forms shadow areas).

In accordance with the present principles, a single layer of n-type material is employed that provides a sufficient amount of conductivity and is thinner than the conventional n-type structures. The single layer emitter does not need a metal grid since, e.g., doped ZnO provides a highly conductive layer. The light output from the present LED with ZnO is expected to be higher than conventional LED at least due to higher transparency and better current spreading.

Figure 2:
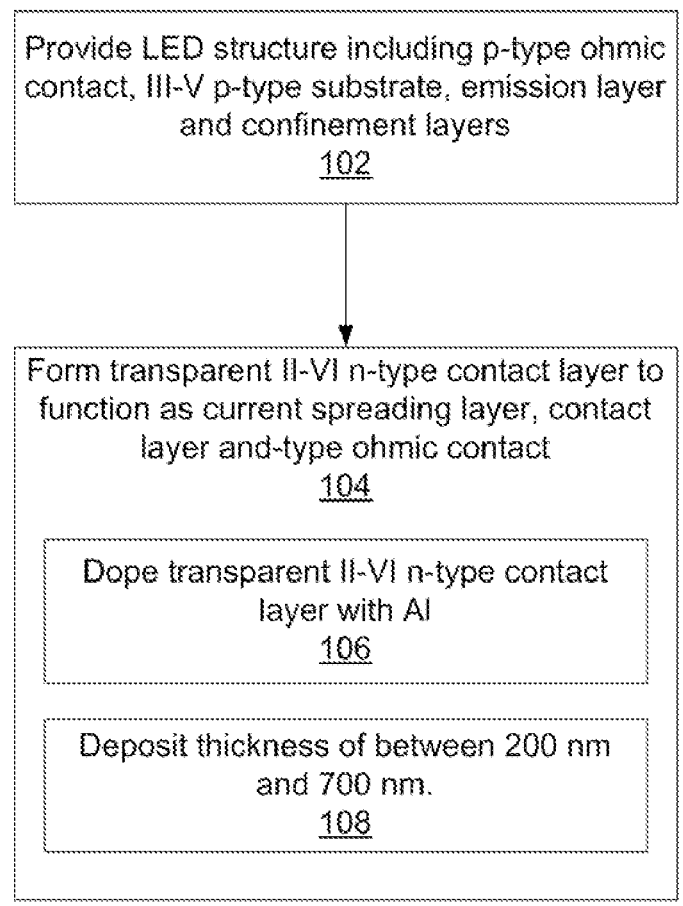
FIG. 2 is a block/flow diagram showing a method for making a light emitting diode in accordance with illustrative embodiments.

Referring to FIG. 2, a method for forming a light emitting diode is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, an LED structure is provided. This includes the preparation and doping of a substrate (e.g., a p-type substrate). The substrate includes a III-V material such as GaAs or other suitable material. A p-type ohmic contact is formed on the substrate. The p-type ohmic contact may include a p-type metal or other highly conductive p-type material. A p-type confinement layer is formed on the p-type substrate. A emission layer, such as, GaInP and in particular AlGaInP for producing red light, is formed on the p-type confinement layer. An n-type confinement layer is formed on the emission layer. The p-type and the n-type confinement layers may include a same base material, e.g., AlInP, and have a substantially same thickness.

In block 104, a transparent II-VI (zinc oxide) n-type contact layer is formed directly on the n-type confinement layer as a replacement for a current spreading layer, a III-V contact layer and an n-type ohmic contact. The II-VI n-type layer (ZnO) is a single layer emitter that replaces three components or layers of a conventional structure. The transparent zinc oxide n-type contact layer may include an amorphous phase.

In block 106, the zinc oxide may be Al doped. The Al doping may include dopant implantation, in-situ doping or doping by forming an Al layer on the ZnO followed by an anneal process to diffuse Al into the ZnO.

In block 108, the transparent zinc oxide n-type contact layer may be deposited to a thickness of between about 200 nm to about 700 nm, preferably about 500 nm. It should be understood that the LED may include additional components or layers that provide other functions, such as buffer layers, multiple active layers, etc.

Having described preferred embodiments of light emitting diode with ZnO emitter (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A red light emitting diode (LED), comprising:
   a p-type monocrystalline III-V substrate;
   a p-type ohmic contact formed directly on the substrate on a first side;
   a p-type AlInP confinement layer formed directly on a second side of the substrate opposite the first side;
   an emission layer formed on the p-type confinement layer and including GaInP for producing red light when activated;
   an n-type AlInP confinement layer on the emission layer, the n-type and p-type confinement layers being symmetrically disposed relative to the emission layer; and
   an amorphous zinc oxide (ZnO) contact layer with a thickness between about 200 and about 700 nm formed directly on the n-type confinement layer, wherein the n-type confinement layer and the p-type confinement layer include a same thickness dimension and base material, and the amorphous ZnO contact layer is configured to function as all of a current spreading layer, a III-V contact layer and an n-type ohmic contact.

2. The LED as recited in claim 1, wherein the ZnO is Al doped.

3. A red light emitting diode (LED), comprising:
   a p-type ohmic contact;
   a GaAs p-doped substrate on the p-type ohmic contact;
   an AlInP p-type confinement layer with a thickness of about 1 micron on the GaAs p-doped substrate;
   an AlGaInP emission layer on the AlInP p-type confinement layer with a thickness of about 0.5 microns;
   an AlInP n-type confinement layer with a thickness of about 1 micron on the AlGaInP emission layer;
   an amorphous zinc oxide (ZnO) contact layer formed directly on the AlInP n-type confinement layer, wherein the amorphous ZnO contact layer has a thickness between about 200 nm and about 700 nm and is configured to function as all of a current spreading layer, a III-V contact layer and an n-type ohmic contact.

* * * * *